(12) United States Patent
Fuergut et al.

(10) Patent No.: US 9,437,513 B2
(45) Date of Patent: Sep. 6, 2016

(54) ELECTRICALLY INSULATING THERMAL INTERFACE ON THE DISCONTINUITY OF AN ENCAPSULATION STRUCTURE

(71) Applicant: Infineon Technologies AG, Neubiberg (DE)

(72) Inventors: Edward Fuergut, Dasing (DE); Manfred Mengel, Bad Abbach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/501,070

(22) Filed: Sep. 30, 2014

(65) Prior Publication Data

US 2015/0102479 A1   Apr. 16, 2015

(30) Foreign Application Priority Data

Oct. 15, 2013  (DE) .................. 10 2013 220 880

(51) Int. Cl.
| | |
|---|---|
| *H01L 23/31* | (2006.01) |
| *H01L 23/367* | (2006.01) |
| *H01L 21/52* | (2006.01) |
| *H01L 21/56* | (2006.01) |

(Continued)

(52) U.S. Cl.
CPC .......... *H01L 23/3157* (2013.01); *H01L 21/52* (2013.01); *H01L 21/56* (2013.01); *H01L 23/3107* (2013.01); *H01L 23/3142* (2013.01); *H01L 23/3675* (2013.01); *H01L 23/4334* (2013.01); *H01L 21/565* (2013.01); *H01L 23/3737* (2013.01); *H01L 2224/32013* (2013.01); *H01L 2224/32245* (2013.01); *H01L 2224/48091* (2013.01); *H01L 2224/48247* (2013.01); *H01L 2224/48465* (2013.01); *H01L 2224/73265* (2013.01); *H01L 2924/1305* (2013.01); *H01L 2924/13055* (2013.01); *H01L 2924/181* (2013.01); *H01L 2924/1815* (2013.01)

(58) Field of Classification Search
CPC ... H01L 21/52; H01L 21/56; H01L 23/3107; H01L 23/3142; H01L 23/3157; H01L 23/3675; H01L 23/4334; H01L 21/565; H01L 2224/32013; H01L 2224/32245; H01L 2224/48091; H01L 2224/48247; H01L 2224/48465; H01L 2224/73265
USPC .......................................... 257/706, 717, 730
See application file for complete search history.

(56) References Cited

U.S. PATENT DOCUMENTS 4,503,452 A * 3/1985 Yokozawa ............. H01L 21/565
257/670
4,887,149 A * 12/1989 Romano' ............. H01L 23/4006
257/718

(Continued)

FOREIGN PATENT DOCUMENTS

| EP | 0774782 A2 | 5/1997 | |
| EP | EP 0774782 A2 * | 5/1997 | ........... H01L 21/565 |

(Continued)

*Primary Examiner* — Earl Taylor

(57) ABSTRACT

Method for manufacturing an electronic semiconductor package, in which method an electronic chip (100) is coupled to a carrier, the electronic chip is at least partially encapsulated by means of an encapsulation structure having a discontinuity, and the carrier is partially encapsulated, and at least one part of the discontinuity and a volume connected thereto adjoining an exposed surface section of the carrier are covered by an electrically insulating thermal interface structure, which electrically decouples at least one part of the carrier with respect to its surroundings.

8 Claims, 5 Drawing Sheets

(51) Int. Cl.
*H01L 23/433* (2006.01)
*H01L 23/373* (2006.01)

(56) References Cited

U.S. PATENT DOCUMENTS

| | | | | |
|---|---|---|---|---|
| 4,950,427 | A * | 8/1990 | Endo | H01L 23/15 257/719 |
| 5,672,910 | A * | 9/1997 | Majumdar | H01L 23/3107 257/690 |
| 5,886,397 | A * | 3/1999 | Ewer | H01L 23/3107 257/667 |
| 6,078,098 | A * | 6/2000 | Ewer | H01L 23/3107 257/667 |
| 6,159,764 | A * | 12/2000 | Kinsman | H01L 23/4334 257/E23.092 |
| 6,576,996 | B2 * | 6/2003 | Egitto | B29C 59/14 257/706 |
| 6,611,047 | B2 * | 8/2003 | Hu | H01L 21/565 257/666 |
| 6,719,871 | B2 * | 4/2004 | Egitto | B29C 59/14 156/272.6 |
| 6,879,040 | B2 * | 4/2005 | Ng | H01C 1/14 257/666 |
| 6,998,702 | B1 * | 2/2006 | Zwenger | H01L 23/3107 257/666 |
| 7,847,395 | B2 * | 12/2010 | Baek | H01L 23/3107 257/712 |
| 7,999,373 | B2 * | 8/2011 | Baldauf | H01L 23/367 257/712 |
| 8,022,539 | B2 * | 9/2011 | Dahilig | H01L 21/565 257/675 |
| 8,048,714 | B2 * | 11/2011 | Chou | H01L 23/4334 257/706 |
| 8,159,000 | B2 * | 4/2012 | Lee | F21K 9/00 257/100 |
| 8,680,656 | B1 * | 3/2014 | Kuo | H01L 31/0508 257/13 |
| 9,184,119 | B2 * | 11/2015 | Eugene Lee | H01L 24/97 |
| 2005/0245060 | A1 * | 11/2005 | Chiu | H01L 23/3677 438/612 |
| 2007/0090514 | A1 * | 4/2007 | Condie | H01L 23/10 257/704 |
| 2011/0133329 | A1 * | 6/2011 | Takahashi | H01L 21/561 257/712 |
| 2013/0020692 | A1 * | 1/2013 | Fujisawa | H01L 23/3107 257/676 |
| 2013/0213697 | A1 * | 8/2013 | Palaniswamy | H01L 33/486 174/254 |
| 2014/0027891 | A1 * | 1/2014 | Kimura | H01L 23/3107 257/675 |
| 2014/0191380 | A1 * | 7/2014 | Lee | H01L 24/97 257/676 |
| 2014/0306245 | A1 * | 10/2014 | Hayashi | H01L 33/62 257/88 |
| 2014/0353814 | A1 * | 12/2014 | Sakamoto | H01L 23/3107 257/712 |
| 2015/0021633 | A1 * | 1/2015 | Yu | H01L 33/642 257/88 |
| 2015/0102479 | A1 * | 4/2015 | Fuergut | H01L 23/3142 257/706 |
| 2015/0228563 | A1 * | 8/2015 | Eugene Lee | H01L 24/97 174/255 |
| 2015/0228581 | A1 * | 8/2015 | Eugene Lee | H01L 24/97 438/118 |
| 2015/0243587 | A1 * | 8/2015 | Yang | H01L 23/49551 257/669 |

FOREIGN PATENT DOCUMENTS

| | | | | |
|---|---|---|---|---|
| JP | | 04299848 A | * 10/1992 | |
| JP | | 05055419 A | * 3/1993 | |
| JP | | 06163743 A | * 6/1994 | |
| JP | | 09153576 A | * 6/1997 | |
| WO | WO | 9406154 A1 | * 3/1994 | H01L 23/4334 |

* cited by examiner

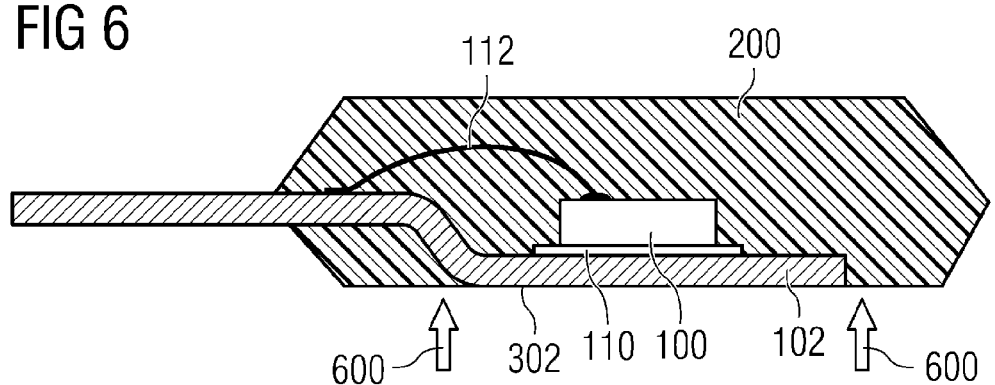
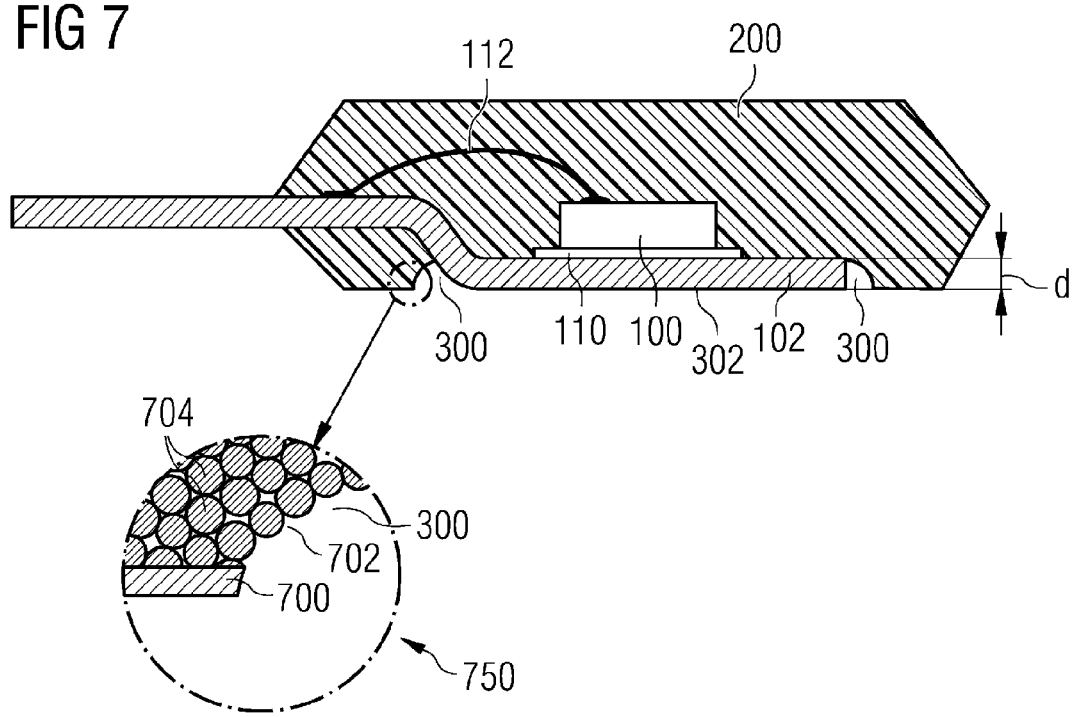

ELECTRICALLY INSULATING THERMAL INTERFACE ON THE DISCONTINUITY OF AN ENCAPSULATION STRUCTURE

BACKGROUND

1. Field

The invention relates to an electronic semiconductor package, an electronic arrangement and a method for manufacturing an electronic semiconductor package.

2. Description of the State of the Art

When package an electronic chip by means of an encapsulation structure, the electronic chip mounted on the electric carrier is cast with an encapsulating compound and thereby a surface region of the electrical carrier is kept free. A thermal interface structure (TIM, thermal interface material), which electrically decouples the electrical carrier with respect to its surroundings and couples it thermally with its surroundings, can then be mounted on one part of the encapsulation structure and the surface region of the electrical carrier. The user can then mount a heat dissipation element, for example in the form of a heat sink, on such an electronic semiconductor package, in order to be able to discharge accumulated waste heat from the electronic semiconductor package to the periphery during the operation of the electronic semiconductor package with the electronic chip (for example a power semiconductor chip).

With an undesirable delaminating of the thermal interface material from the encapsulation structure, disruptive leakage currents can form between the surroundings of the electronic semiconductor package and the electrical carrier coupled to an electronic chip, which affect the dielectric strength of the electronic semiconductor package.

SUMMARY

There could be a need to house electronic chips with a high electric dielectric strength.

According to an exemplary embodiment, a method for manufacturing an electronic semiconductor package is created, in which method an electronic chip is coupled to a carrier, the electronic chip is at least partially encapsulated and the carrier is partially encapsulated by means of an encapsulation structure having a discontinuity. At least one part of the discontinuity and a volume connected thereto adjoining an exposed surface section of the carrier is covered by an electrically insulating thermal interface structure, which electrically decouples at least one part of the carrier with respect to its surroundings.

According to another exemplary embodiment, an electronic semiconductor package is created, which has an electronic chip, a carrier coupled to the electronic chip, an encapsulation structure at least partially encapsulating the electronic chip and partially encapsulating the carrier, wherein the encapsulation structure comprises a discontinuity and an electrically insulating thermal interface structure, which covers at least one part of the discontinuity and a volume connected thereto, which adjoins the carrier, wherein the thermal interface structure electrically decouples at least one part of the carrier with respect to its surroundings.

According to another exemplary embodiment, an electronic arrangement is provided, which has an electronic chip, a carrier coupled to the electronic chip, an encapsulation structure at least partially encapsulating the electronic chip and partially encapsulating the carrier, wherein the encapsulation structure has a discontinuity, an electrically insulating thermal interface structure, which covers at least one part of the discontinuity and a volume connected thereto, which adjoins the carrier, in order to decouple at least one part of the carrier electrically with respect to its surroundings, and a heat dissipation element, which is externally connected to the thermal interface structure to provide a thermal coupling with the carrier.

One exemplary embodiment has the advantage that, by covering (in particular, filling) a discontinuity at the encapsulation structure with material of the thermal interface structure, the path length ("creeping distance"), over which an electrical leakage current has to travel in order to reach the carrier with the electronic chip mounted thereon from the exterior of the electronic semiconductor package actually covered by the thermal interface structure, is increased significantly. In other words, the length of the current path, which a leakage current has to overcome in order to propagate between the surroundings of the electronic semiconductor package and the interior of the electronic semiconductor package, is increased. This leads to an increase in the dielectric strength and to an improvement in the electronic performance of the electronic semiconductor package. The formation of the discontinuity and covering the same with the thermal interface material effects an improved adhesion of the thermal interface structure to the encapsulation structure due to the increased contact surface, whereby the susceptibility of the electronic semiconductor package to leakage current is further reduced. The measures described also render the electronic semiconductor package and, in particular, its package, suitable for use with particularly high electric voltages, which is extremely advantageous, particularly in the area of semiconductor components with power chips. According to the exemplary embodiment described, a robust semiconductor package can be made available, which provides a reliable electrical insulation, even under stress or with a high mechanical or electrical load. The reliable and secure attachment of the thermal interface structure to the encapsulation structure thus increases the operational reliability of the electronic semiconductor package.

DESCRIPTION OF FURTHER EMBODIMENTS

Additional exemplary embodiments of the electronic semiconductor package, the electronic arrangement and the method for manufacturing an electronic semiconductor package are described in the following.

One underlying idea of the exemplary embodiments can be seen in that a peripheral well is placed in the outer area between the heat sink/chip carrier package and the compound encapsulating the component (encapsulation structure), which peripheral well is utilized by filling the same with a thermally conductive and electrically insulating compound in the form of the thermal interface structure, in order to improve the electrical insulation of a two-material component system. By placing a recess or other discontinuity in and/or on the encapsulating material or in and/or on the encapsulation structure of the electronic chip around the heat sink component or the electrical carrier or chip carrier (for example a copper lead frame), the adhesion can be improved and the path to be traversed by a leakage current (in concrete terms, around the filled or covered discontinuity) can be extended. Advantageously, a reliable adhesion of the material of the thermal interface structure to the encapsulation structure can thereby be achieved by an increase in the contact surface and a mechanical interlocking between the encapsulation structure and the covered or filled discontinuity. Additionally, a better electrical insulation strength can be achieved at the critical edge regions of the component. Furthermore, an increase in the reliability of the component can be achieved by this method.

According to an exemplary embodiment, the term "discontinuity" is understood, in particular, as each specifically formed and locally limited structural modification (in particular, each geometrical discontinuity) compared to a continuous (in particular, planar) surface environment at the outer surface of an encapsulation structure, to which a thermal interface structure can be mechanically anchored in order to effect a reliable electrical insulation here. In particular, a local increase in the surface can be effected with the formation of such a discontinuity, in particular, with the extension of a leakage current path and/or increase in a seating between the thermal interface structure and the encapsulation structure. Examples of such discontinuities are recesses, protrusions, cavities, indentations, scoring, roughening, steps, etc.

According to an exemplary embodiment, the term "coupling" is understood as, in particular, forming a mechanical connection.

According to an exemplary embodiment, the term "electrical coupling" is understood as, in particular, forming an electrically conductive connection, in particular, by means of bonding. Coupling methods suitable for this are wire bonding, sintering with electrically conductive material (for example silver paste) and/or soldering.

According to an exemplary embodiment, the term "encapsulating" is understood as, in particular, enclosing or encapsulating with the material of an encapsulation structure. Accordingly, such an encapsulation structure can also be referred to as an enclosure or an encapsulating structure.

According to an exemplary embodiment, a combination of a material of an encapsulation structure and preferably another material of a thermal interface structure is used. The material of the encapsulation structure can then be, for example, mechanically harder than the mechanically softer material of the thermal interface structure and can thus fulfill the function of mechanically stabilizing the enclosed electronic chip and the enclosed electronic leads. In contrast, the material of the thermal interface structure, as a functional compound with its softer properties, can clearly mold to a heat dissipation element and thus, in particular, in combination with its own preferably good thermal conductivity, can effect a good thermal coupling. The encapsulation material (for example, plastic material) can be produced, for example, considerably more cheaply than the material of the thermal interface structure, frequently more costly to produce (which can, for example, have aluminum nitride or boron nitride, which are complex and expensive to produce). The properties of the material of the encapsulation structure and of the material of the thermal interface structure can thus be at least partially complementary. According to one exemplary embodiment, a specific combination of these two materials is used, in order to have, independently of each other, a high measure of design freedom for fulfilling the described respective functions of the material of the encapsulation structure and the material of the interface structure. Such an approach differs from conventional full pack modules, where only one encasing material is provided and thus compromises must be made between the different requirements.

According to an exemplary embodiment, the carrier is designed as an electrical carrier. Such an electrical carrier can be formed, in particular, at least partially of an electrically conductive material. Alternately, the carrier can also be designed so as to be electrically insulating.

According to an exemplary embodiment, the thermal interface structure can be designed to provide a thermal coupling between the electrical carrier and a heat dissipation element, which can be connected to the thermal interface structure. Such a heat dissipation element can be formed as a heat dissipation element, which efficiently discharges heat from the electronic chip into the surroundings.

According to an exemplary embodiment, the method can feature a formation of the discontinuity or recess during encapsulation. In other words, the formation of the encapsulation structure for the at least partial encapsulation of the electronic chip and the electrical carrier and the formation of the discontinuity in the encapsulation structure can take place simultaneously. This enables a particularly fast process.

According to an exemplary embodiment, the discontinuity can be formed by means of a protrusion formed inversely to the discontinuity on an encapsulation tool (or in a cavity of such an encapsulation tool), whereby a flow of encapsulation material into the discontinuity is precluded. After the curing of the encapsulation material introduced into the encapsulation tool in a fluid state, the electronic semiconductor package or a preform of the same can be removed from the encapsulation tool and can already have the desired discontinuity at this time, owing to the protrusion in the encapsulation tool. With such a molded variant, a dimension of 200×200 µm (width×depth) of the furrows can be realized with 20° mold inclines.

According to an alternate exemplary embodiment, the method can feature forming of the discontinuity only after the encapsulation. This has the advantage that, by means of the selective choice of a method of material removal for forming the discontinuity, the latter can be produced with a high precision and also in very small dimensions, if this is desired or required.

According to an exemplary embodiment, the discontinuity can be formed by means of removing encapsulation structure material after the material of the encapsulation structure is cured. This has the further advantage that, by removing the surface material of the encapsulation structure only after its creation in an encapsulation tool, a surface layer of the encapsulation structure with adhesion properties which are often disadvantageous is necessarily removed in forming the discontinuity, which thus enables a better adhesion of the thermal interface structure to material in the interior of the encapsulation structure, often with better adhesion properties.

According to an exemplary embodiment, the discontinuity can be formed by means of at least one of the group consisting of a laser treatment, grinding, scraping, plasma treatment and etching. The laser treatment can be performed, in particular, by laser grooving and can, for example, result in dimensions of 200 µm×100 µm (width×depth). The laser treatment can also be by laser roughening, with which, for example, the dimensions of the discontinuity can be adjusted to 200 µm×30 µm or 200 µm×10 µm (width×depth). To form the discontinuity, the material can thus be removed by a chemical method (for example, wet etching or plasma etching) and/or by a physical method (for example, material removal by mechanical treatment or by treatment with high-energy radiation).

According to an exemplary embodiment, a surface of the encapsulation structure outside the discontinuity can have a waxy surface structure, wherein the method comprises a removal of the encapsulation structure material down to such a depth that the waxy surface layer is removed locally at the site of the discontinuity, so that the discontinuity is delimited at least in sections by a rough or grainy wall of the mold structure, which is formed, in particular, by filling particles of the mold structure. This has the further advantage that, by removing the surface material of the mold structure only after its production by means of coating, a waxy surface layer resulting from this process is necessarily removed by the formation of the discontinuity and this enables a better adhesion of a rougher, more rigid layer in the interior of the encapsulation structure with the thermal interface structure. It has been shown that a considerably improved adhesion of the thermal interface structure to the encapsulation structure can be achieved by first removing, for example, 10 μm at the surface of the encapsulation structure.

According to an exemplary embodiment, the discontinuity can be formed by means of removing encapsulation structure material, while the electrical carrier functions as a removal stop. For example, by means of selective etching with the use of an etching mask, the material of the encapsulation structure can be removed by means of etching, while this etching process leaves the material of the electrical carrier unaffected. Something similar can be achieved with a laser treatment. Thereby, a very precise removal stop, and thereby the depth of the discontinuity to be formed, can be defined without additional effort.

According to an exemplary embodiment, the discontinuity can be formed as an annular discontinuity. In particular, the annular discontinuity can be formed to surround the exposed surface section of the electrical carrier extensively. Accordingly, the discontinuity can be an annular discontinuity, which surrounds a surface section of the electrical carrier extensively and which extends into the encapsulation structure. The penetration of undesirable leakage currents into the interior of the electronic semiconductor package can be reliably prevented by an annular, that is, self-contained, discontinuity.

Alternately, the discontinuity can also only extend around a partial region of the electrical carrier, that is, not closed as an annulus, but designed as an open structure. Such a configuration, which can be produced particularly quickly and easily, is sufficient if, due to the geometry of the electronic semiconductor package, in particular, due to a corresponding relative arrangement between the electrical carrier and the electronic chip, only certain regions are susceptible to the penetration of leakage currents and are to be protected accordingly.

The discontinuity (or the complementary thermal interface structure) can also be formed of several continuous or discontinuous substructures. Multiple concentric rings can be provided, for example, which further improve the electric dielectric strength and the adhesion properties.

According to an exemplary embodiment, the part of the thermal interface structure filling the connected volume can have a continuous planar structure (for example, a planar layer), with a first planar surface in direct contact with the electrical carrier and with an opposing second planar surface, which is exposed in order to be brought into direct contact with the heat dissipation element. The thermal interface structure can thus be formed in one piece, as a planar sheet component (one layer or several layers) with an integral projection.

According to an exemplary embodiment, a covering or filling method can be selected from a group consisting of printing the thermal interface structure into the discontinuity and onto the connected volume, dispersing material for forming the thermal interface structure into the discontinuity and onto the connected volume, laminating the thermal interface structure into the discontinuity and onto the connected volume, and immersing at least one part of an external surface of the encapsulated electronic chip and the encapsulated electronic carrier into an at least partially liquid precursor for forming the thermal interface structure. Thus, a broad range of methods suitable for this is provided for forming the thermal interface structure and its reliable adhesive attachment to the encapsulation structure and the electric carrier.

According to an exemplary embodiment, the method can feature a connection (in particular, a mechanical connection) of the heat dissipation element with the thermal interface structure. Such a connection of the heat dissipation element with the thermal interface structure can be made by the user, so that a user can freely select a suitable heat dissipation element, in order to be able to use this in a flexible manner with a specific electronic semiconductor package. Alternately, however, the factory can also connect the heat dissipation element to the thermal interface structure.

According to an exemplary embodiment, the electric carrier can have a lead frame. This lead frame can be made of copper material, for example. The lead frame can be partially embedded in the encapsulation structure and can extend from the encapsulation structure to another part, in order to be connected to an electrical partner device. Any other carrier can be used as the mounting base for the electronic chip in place of a lead frame, for example, also a ceramic substrate or a punched metal plate.

According to an exemplary embodiment, the electronic chip can be a semiconductor chip, in which at least one integrated circuit element is contained. Examples of such circuit elements are transistors (for example, field effect transistors, bipolar transistors), diodes, sensors, actuators or MEMS components. The electronic chip can be formed as a power chip, that is, for use in power electronics.

Multiple chips can also be provided in the electronic semiconductor package. The electronic chip can be mounted on the electrical carrier, preferably in an electrically conductive (and preferably also thermally conductive) manner (for example, by means of soldering, sintering and/or bonding).

According to an exemplary embodiment, the thermal interface structure can be in direct contact with the electrical carrier within the discontinuity. Thereby, a particularly good thermal coupling is made possible between the electronic chip, the electrical carrier and the thermal interface structure, which is advantageous for the dissipation of heat during the operation of the electronic chip. Simultaneously, a good electrical decoupling between the electronic chip and the electrical carrier, on the one hand, and a periphery of the electronic semiconductor package, on the other hand, is facilitated by the thermal interface structure, which ensures the perfect electronic functionality of the electronic semiconductor package. According to an exemplary embodiment, the thermal interface structure can thus preferably have a thermally conductive and electrically insulating material.

According to an alternate exemplary embodiment, the thermal interface structure within the discontinuity can be spaced from the electrical carrier by means of the material of the encapsulation structure. The current path length to be traversed by a leakage current as far as a conductive section within the electronic semiconductor package is then particularly long, and the protection against undesirable penetration is highly effective.

According to an exemplary embodiment, the thermal interface structure can have a thickness in a range between approximately 20 μm and approximately 500 μm, in particular in a range between approximately 100 μm and approximately 200 μm. With these thicknesses, a reliable electrical insulation can be provided, on the one hand, as well as a high level of thermal coupling, on the other hand.

According to an exemplary embodiment, the discontinuity can have side walls, of which at least one can be inclined into the encapsulation structure by an angle in a range of between approximately 5° and approximately 35°, in particular, in a range of between approximately 10° and approximately 30°, with respect to a vertical extension. With such an inclined configuration, the adhesive properties of the thermal interface structure to the encapsulation material can be designed particularly effectively by way of a material interlocking.

According to an exemplary embodiment, the thermal interface structure can feature a solid body matrix (for example, of resin) with filling particles embedded therein. The thermal interface structure can be formed, for example, from a mixture of a resin and filling materials. The resin can be silicon-based, for example, epoxy-based and/or thermoplastic-based. The filling materials can have, for example, silicon oxide, aluminum oxide, aluminum nitride, boron nitride, silicon carbide, silicon nitride and/or diamond.

According to another exemplary embodiment, the thermal interface structure can feature a formless viscous material. In the electronic semiconductor package, the thermal interface structure can also be formed as a paste, for example, as formless silicon or wax.

The thermal interface structure in the electronic semiconductor package can also be provided as a rigid layer, however, as a cured polymer, for example. For example, the thermal interface structure can be punched from a sheet.

According to an exemplary embodiment, the heat dissipation element can feature a connection plate and heat dissipation fins, which extend from the connection plate. The heat dissipation element is preferably formed from a particularly good thermally conductive material, for example, aluminum or copper. The connection plate can serve as a coupling surface with the thermal interface structure, while the heat dissipation fins can create a large effective surface, which results in an effective thermal balance with the surroundings (for example, a surrounding or even flowing fluid, for example, air). Thereby, heat dissipated from the electronic semiconductor package can be effectively discharged during the operation of the electronic chip.

According to an exemplary embodiment, the encapsulation structure can have multiple discontinuities, which are at least partially filled by the electrically insulating thermal interface structure. By providing multiple discontinuities, the properties in respect of the leakage current behavior and the adhesion can be further improved.

According to an exemplary embodiment, the thermal interface structure can be formed with multiple layers. The thermal performance properties and the electrical insulation properties can thereby be specifically adapted to the requirements of the individual case.

According to an embodiment, the thermal interface structure can have a higher thermal conductivity than the encapsulation structure, in particular a thermal conductivity of more than approximately 1 W/mK. In using mold material for the encapsulation structure, for example, a thermal conductivity of the encapsulation structure of approximately 1 W/mK can be provided.

According to an exemplary embodiment, the electronic semiconductor package can be designed as a module, in which multiple electronic chips are combined with one another. This results in an efficient and reliable electrical operational mode, an efficient heat dissipation and, at the same time, a small overall size. Thus, with the encapsulation concept according to an exemplary embodiment, complex electronic functions can be integrated on the system level. The electronic chips can be designed, for example, as power semiconductor chips. Examples of integrated circuit elements, which can be integrated in such electronic chips, are transistors (in particular, field effect transistors or bipolar transistors, other transistors, in particular, bipolar transistors with insulated gate electrode (IGBT)), diodes (in particular, free-wheeling diodes), etc. Such integrated circuit elements and others can be combined and wired, for example, as half bridges, full bridges, sixpack power modules, etc. Possible uses of such semiconductor packages or modules are power electronics, hybrid vehicles, and other automotive uses, control electronics for white goods, etc. Since, according to the exemplary embodiments, a particularly efficient energy conversion is supported in a confined space, applications in high-energy technologies (for example, electric mobility, white goods) are also possible.

In particular, the electronic chips can be semiconductor chips, i.e. they can feature integrated circuit elements, which are formed on and/or in a semiconductor substrate. Group IV semiconductors, such as silicon or germanium, or group III-V semiconductors, such as gallium arsenide, are suitable as possible semiconductor substrates. Any substrates can be used (for example, also silicon carbide), which do not necessarily have to be formed from semiconductor materials.

SHORT DESCRIPTION OF THE FIGURES

Embodiments are illustrated in the figures and are outlined in more detail in the following.

In the figures:

FIG. 6 to FIG. 9 are different cross-sections of respective structures, which are obtained during the utilization of a method for manufacturing an electronic semiconductor package in accordance with another exemplary embodiment, wherein the electronic semiconductor package obtained is depicted in FIG. 9.

DETAILED DESCRIPTION OF THE EXEMPLARY EMBODIMENTS

Figure 1:
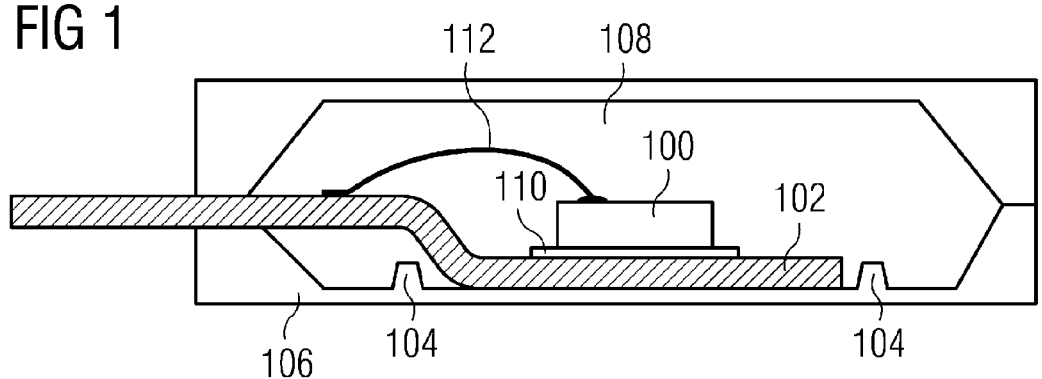
FIG. 1 to FIG. 4 are different cross-sections of respective structures, which are obtained during the implementation of a method for manufacturing an electronic semiconductor package according to an exemplary embodiment, wherein the electronic semiconductor package obtained is depicted in FIG. 4.

The same or similar components in the various figures are provided with the same reference numerals.

Before the exemplary embodiments are described with reference to the figures, some general considerations of the exemplary embodiments are outlined:

The adhesion of the thermal interface structure to the component housed by means of the mold structure is often problematic due to the material since, due to the production (in particular, due to the use of an injection molding method), a waxy surface can form on the encapsulation structure. Due to the weakened boundary surface, the reliability of the insulation is limited over the product lifetime of the electronic semiconductor package. The risk of delaminating can affect the dielectric strength of the component since currents from the exterior of the electronic semiconductor package can reach the electric carrier or the electronic chip through the then partially delaminated thermal interface structure and, there, can lead to damage to or the destruction of the component.

In conventional thermal interface structures, the dielectric strength is ensured in that an extended contact surface is utilized. This solution is not practical due to the lack of manageability on the level of the package. A further option is to ensure the insulation by using a single material for the encapsulating compound. Here, the limited thermal performance and heat conductivity of the moldable encapsulating compound is disadvantageous.

In order to overcome these disadvantages, a discontinuity (in particular, in the form of a recess, in the form of a locally limited surface recess or groove, for example) is formed in the encapsulation structure in accordance with an exemplary embodiment, and the discontinuity and an exposed carrier surface are protectively covered against electrical current flow by means of a one-piece thermal interface structure. This extends and complicates the leakage current path and thereby increases the electrical dielectric strength (up to a voltage of 5 kV and higher, for example), wherein, at the same time, an effective protection against undesirable delamination is also achieved, which increases the effective contact surface between the encapsulation structure and the thermal interface structure and thereby the mutually effective adhesive force, by means of the filled recess.

Figure 2:
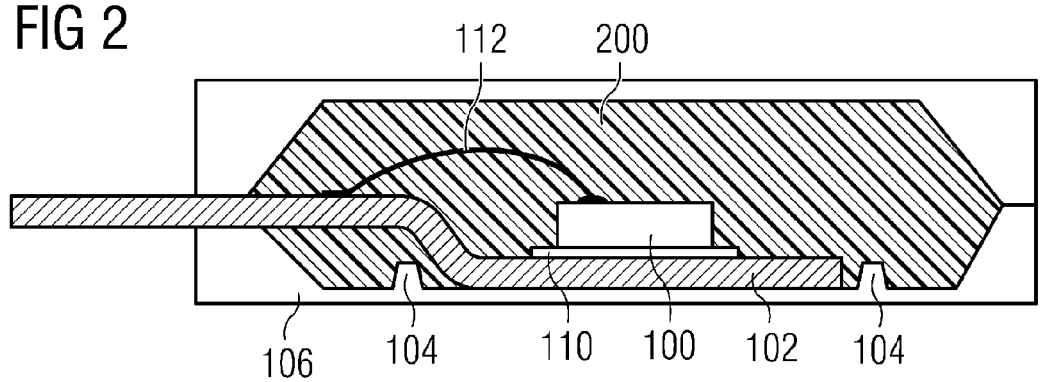
Figure 3:
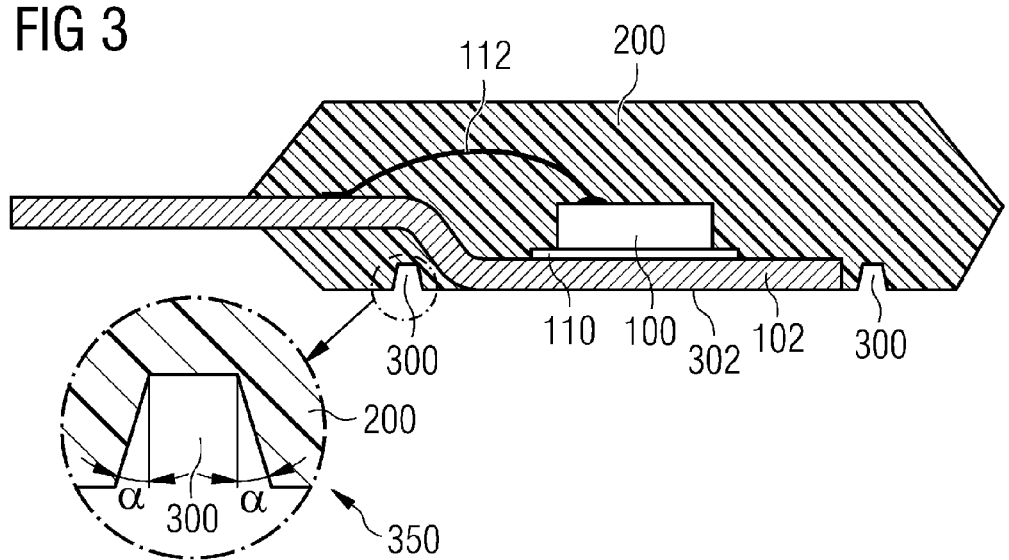
Figure 4:
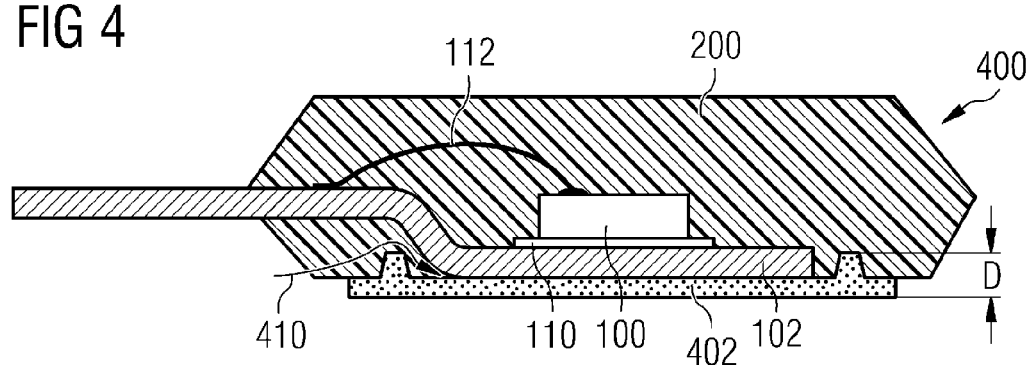

FIG. 1 to FIG. 4 depict different cross-sections of respective structures, which are obtained during the utilization of a method for manufacturing an electronic semiconductor package 400 in accordance with an exemplary embodiment, wherein the electronic semiconductor package 400 obtained in accordance with an exemplary embodiment is depicted in FIG. 4. Thus, in the following, a method for manufacturing the electronic semiconductor package 400 is described.

In order to obtain the structure depicted in FIG. 1, an electronic chip 100, which is designed here in the form of a semiconductor power chip with a vertical current flow in accordance with FIG. 1 to FIG. 5, is first mounted on an electrical carrier 102 in the form of a copper lead frame, by means of, for example, an electrically conductive contact structure 110, for example, a solder, sinter and/or adhesive layer. It is also depicted in FIG. 1 that the electronic chip 100 coupled to the electric carrier 102 by means of wire bonding is additionally electrically coupled by means of a bonding wire 112.

The arrangement thus obtained is then inserted into a cavity 108 of an encapsulation tool 106, in order for this then to undergo an injection molding process. The encapsulation tool 106 has an annular, circumferential protrusion 104 in the interior of the cavity 108.

In order to obtain the structure depicted in FIG. 2, the electronic chip 100 is molded completely and the electrical carrier partially with an encapsulation structure 200, which, due to the presence of the protrusion 104, is produced with a discontinuity 300 depicted in FIG. 3, by means of injecting a fluid casting compound (for example, plastic-based) into the cavity 108 of the encapsulation tool 106. In the exemplary embodiment described, the discontinuity 300 in the form of a furrow is thus produced by a corresponding geometry of the encapsulation tool 106. The annular discontinuity 300 in the encapsulation structure 200 created, depicted only in cross-section in FIG. 3, as can again be seen in FIG. 2, is formed on the encapsulation tool 106 by means of the protrusion 104 formed inversely to the discontinuity 300, whereby a flow of encapsulation material into the discontinuity 300 during the encapsulation is precluded. The initially still fluid casting compound is then cured in order to achieve the complete encapsulation of the electronic chip 100 and the partial encapsulation of the electrical carrier 102. Thus, in the exemplary embodiment described, the discontinuity 300 is formed during the encapsulation process, so that no separate process is required for this.

In order to obtain the structure depicted in FIG. 3, the encapsulation tool 106 is removed after the curing of the encapsulation structure 200. Even though this cannot be seen in the cross-sectional views of FIG. 2 and FIG. 3, the, in this case, annular discontinuity 300 is formed to surround an exposed surface section 302 of the electrical carrier 102 extensively. It can be seen in FIG. 3 that the surface region 302 of the electrical carrier 102 is exposed to its surroundings after removal from the encapsulation tool 106.

It can be seen in the detail 350 of FIG. 3 that the discontinuity 300 has oblique side walls, which are inclined by an angle $\alpha$, of, for example, 20° with respect to a vertical extension into the encapsulation structure 200. Thus, the adhesion properties of a thermal interface structure 402 to be formed at a later stage can be facilitated on the encapsulation structure 200.

Figure 5:
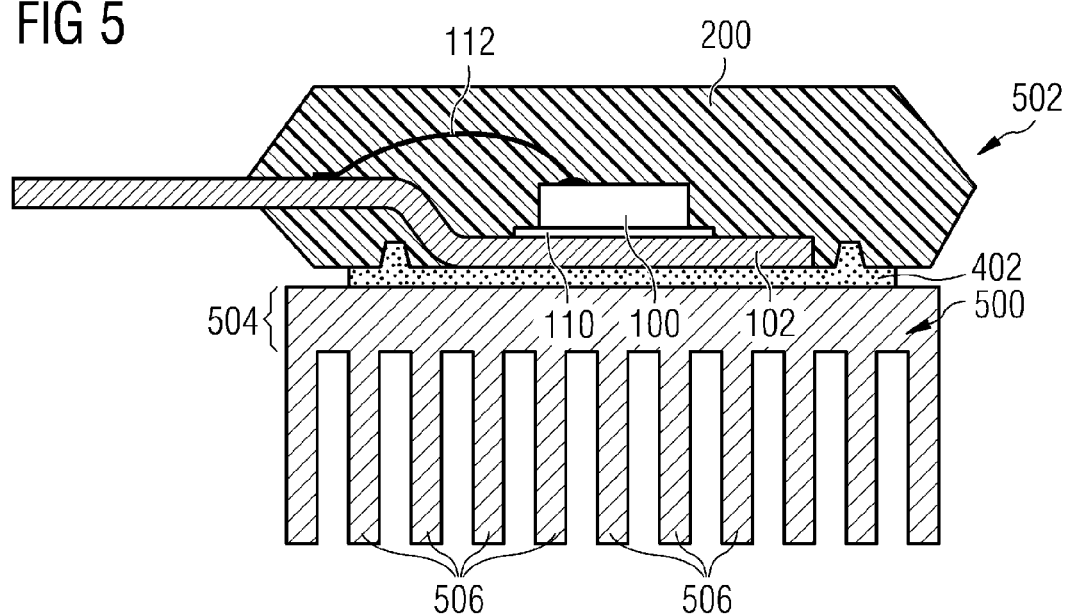
FIG. 5 depicts an electronic arrangement according to an exemplary embodiment, which is formed by mounting a heat dissipation element on an electronic semiconductor package produced in accordance with FIG. 4.

In order to obtain the electronic semiconductor package 400 depicted in FIG. 4, the discontinuity 300 and a volume connected thereto, which adjoins the exposed surface section 302 of the electrical carrier 102, are filled with an electrically insulating and thermally well-conducting thermal interface structure 402 (thermal interface material, TIM), which is formed to provide a thermal coupling between the electrical carrier 102, and a heat dissipation element 500 depicted in FIG. 5. The latter can be connected to the thermal interface structure 402 by the user. Apart from the thermal coupling between the interior of the semiconductor package and the exterior of the semiconductor package, the thermal interface structure 402 simultaneously brings about the electric decoupling and mechanical protection of the electrical carrier 102 and the electronic chip 100 mounted thereon with respect to the semiconductor package exterior. By a variety of processes (pressing, dispersing, laminating, immersing, etc.), the approximately 100 μm to 200 μm thick thermal interface structure 402 or TIM layer in the exemplary embodiment depicted can be mounted so that it fills the furrow in the form of the annular discontinuity 300. The thermal interface structure 402 thus has an entire thickness, D, here, approximately 100 μm to 200 μm, as illustrated in FIG. 4. The thermal interface structure 402 can have a solid body layer of resin with embedded filling particles or, alternately, can be shaped from a formless material (for example, a paste).

FIG. 4 is also a schematic depiction of a leakage current path 410, that is, a current path which an undesirable leakage current must travel, for example, where there is leakage between the material of the encapsulation structure 200 and the thermal interface structure 402, in order to penetrate into the interior of the electronic semiconductor package 400 in an undesirable manner. In this case, the leakage current 410 (or penetrating humidity) can lead to an electrical breakdown and thus damage the electronic components inside the electronic semiconductor package 400, in particular, the electronic chip 100. It can be seen from the form and the length of the leakage current path 410 that, by forming the discontinuity 300 in the encapsulation structure 200 and filling the same with thermal interface structure 402 material, the effective length of the leakage current path 410 is increased prior to triggering undesirable effects in the interior of the electronic semiconductor package 400 in accordance with the exemplary embodiment described, so that, even in the unlikely case of a delamination of the thermal interface structure 402 from the encapsulation structure 200 or the surface section 302 of the electrical carrier 102, the electrical dielectric strength is increased. At the same time, however, the usually critical adhesion of the thermal interface structure 402 to the encapsulation structure 200 is also improved by filling the discontinuity 300 with thermal interface structure 402 material by, on the one hand, increasing the contact surface between these two components and, on the other hand, by bringing about an additional mechanical interlocking, increasing the adhesion.

In order to obtain the electronic arrangement 502 depicted in FIG. 5, a heat dissipation element (heat sink) is directly thermally and mechanically connected to the thermal interface structure 402. FIG. 5 thus depicts the electronic arrangement 502 in accordance with an exemplary embodiment, which is formed by mounting the heat dissipation element 500 on an electronic semiconductor package 400 produced in accordance with FIG. 4. The heat dissipation element 500, as a heat sink, can be connected by the customer. According to FIG. 5, the heat dissipation element 500 is designed as a connection plate 504 made from a single material, for example, from copper, from which multiple spaced heat dissipation fins 506 extend. The connection plate 504 serves as a coupling surface with the thermal interface structure 402. The heat dissipation fins 506 have a large effective surface, which is conducive to an effective thermal balance with the surroundings.

Figure 8:
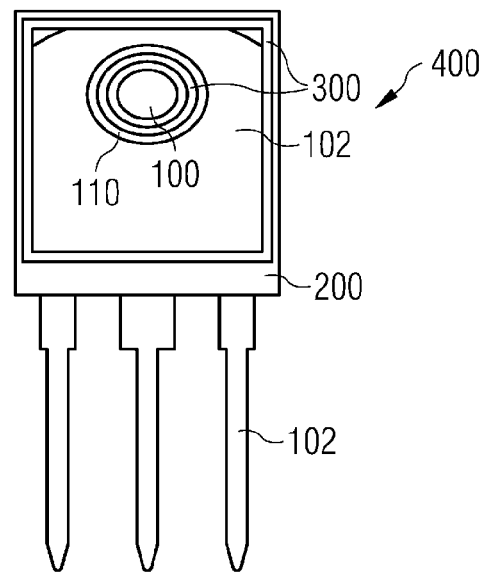
Figure 9:
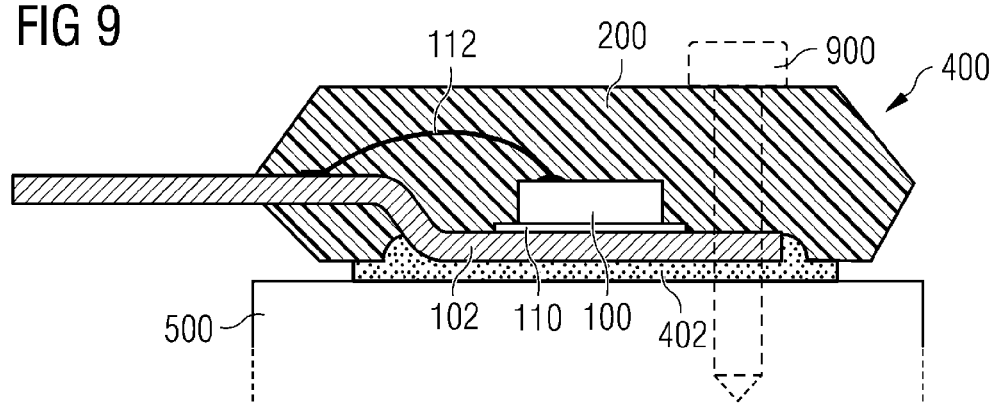

FIG. 6 to FIG. 9 depict different cross-sections of respective structures, which are obtained during the utilization of another method for manufacturing an electronic semiconductor package 400 in accordance with an exemplary embodiment, wherein the electronic semiconductor package 400 obtained is depicted in FIG. 9. The alternate production method described with reference to FIG. 6 to FIG. 9 differs from the method previously described in that the formation of the discontinuity 300 only starts after the completion of the encapsulation of the electronic chip 100 and of the electrical carrier 102 with the casting compound of the encapsulation structure 200.

In order to obtain the structure depicted in FIG. 6, a process as described with reference to FIG. 1 to FIG. 3 is undertaken, with the difference that, in this case, the encapsulation tool 106 is free of the protrusions 104.

Instead, as can be seen in FIG. 6 and FIG. 7, the discontinuity 300 is now formed by removing previously cast encapsulation structure 200 material after the encapsulation structure 200 material has cured. For this, as indicated schematically by the arrows 600 in FIG. 6, the encapsulation structure 200 material is removed using a laser, by means of "laser grooving" or "laser roughening" (or alternately, chemically, for example, by means of etching, or mechanically, for example, by means of grinding). According to the exemplary embodiment depicted, then, the furrow is produced by means of a laser. The annular discontinuity 300 is thus formed by removing material from the encapsulation structure 200, wherein the electrical carrier 102 functions as a removal stop as the material is removed (see FIG. 7). The electrical carrier 102, which is formed of copper, for example, thereby resists the impact of the laser without any appreciable material removal, so that the depth of the discontinuity 300 formed in the exemplary embodiment depicted can be defined particularly precisely. If the electrical carrier 102 functions as a removal stop, then, unlike in accordance with FIG. 3, the discontinuity 300 subsequently directly adjoins the electrical carrier 102. The thermal interface structure 402 then also directly adjoins the electrical carrier 102 after its formation.

As an additional advantage of this embodiment, the surface roughening of the material of the encapsulation structure 200 brought about by the material removal can be viewed as achieving an improved adhesion, as is described in the following with reference to the detail 250 depicted in FIG. 7. Due to the injection molding production method, a surface of the encapsulation structure 200 outside the discontinuity 300 has a waxy surface layer 700, to which the thermal interface structure 402 adheres only moderately. In order to improve the adhesion properties of the encapsulation structure 200 locally, the method comprises the removal of material from the encapsulation structure 200 down to a depth, d (of, for example, at least 10 μm), so that the waxy surface layer 700 is removed locally at the site of the discontinuity 300. The discontinuity 300 is then also delimited by a grainy or rough wall 702 of the encapsulation structure 200, which is formed by filling particles 704 (as a precursor component for forming the encapsulation structure 200).

The thermal interface structure 402 can be applied after the formation of the discontinuity 300 by means of material removal while exposing the grainy material in the region of the filling particles 704 with good adhesion properties, as described above with reference to FIG. 4, in order to obtain the electronic semiconductor package 400 in accordance with the exemplary embodiment described.

FIG. 8 is a schematic depiction of a plan view of the electronic semiconductor package 400. The closed annular enclosure of, in this case, two discontinuities 300, which then has to be filled with the thermal interface structure 402, can be seen in FIG. 8.

A first annular discontinuity 300 forms an enclosure adjoining an outer periphery of the encapsulation structure 200. Additionally, a second annular discontinuity 300 is depicted in FIG. 8, which forms an enclosure adjoining an outer periphery of the electronic chip 100.

In the embodiment depicted in FIG. 8, an annular closure, in particular, of the external discontinuity 300 and, consequently, of the protrusion of the thermal interface structure 402, is not absolutely necessary. In an upper region according to FIG. 8, the clearance between the electronic chip 100 and the discontinuity 300 is particularly small, so that a penetration of current is particularly critical at this location. In contrast, in a lower region according to FIG. 8, the distance between the electronic chip 100 and the discontinuity 300 is larger, so that a penetration of a current is less critical here. Thus, the discontinuity 300 and its filling can be optionally omitted in this lower region and both of these can be limited to the critical regions.

FIG. 9 is a cross-sectional view of the finished electronic semiconductor package 400 with a thermal interface structure 402 in situ. A fastening element 900, depicted in the exemplary embodiment as a screw, can be used for an even better mechanical connection of the individual components of the electronic semiconductor package 400 as a whole with a heat dissipation element 500 as depicted in FIG. 9.

Figure 10:
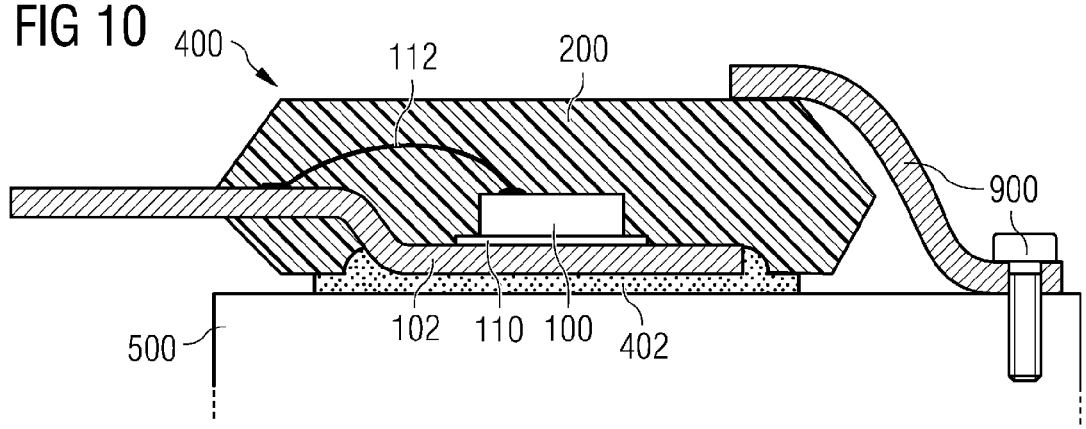
FIG. 10 depicts an electronic semiconductor in accordance with an exemplary embodiment formed alternately to FIG. 9.

FIG. 10 depicts an electronic semiconductor package 400 formed alternately to FIG. 9, in accordance with an exemplary embodiment, wherein the fastening element 900 is formed as a spring-like clamp, which is fastened to the heat dissipation element 500 by means of a fastening screw.

Instead of connecting the semiconductor package 400 and the heat dissipation element 500 by means of a fastening element 900 (see FIG. 9 and FIG. 10), the heat dissipation element 500 can also be formed as a heat sink on the thermal interface structure 402, by means of a molding method.

Figure 11:
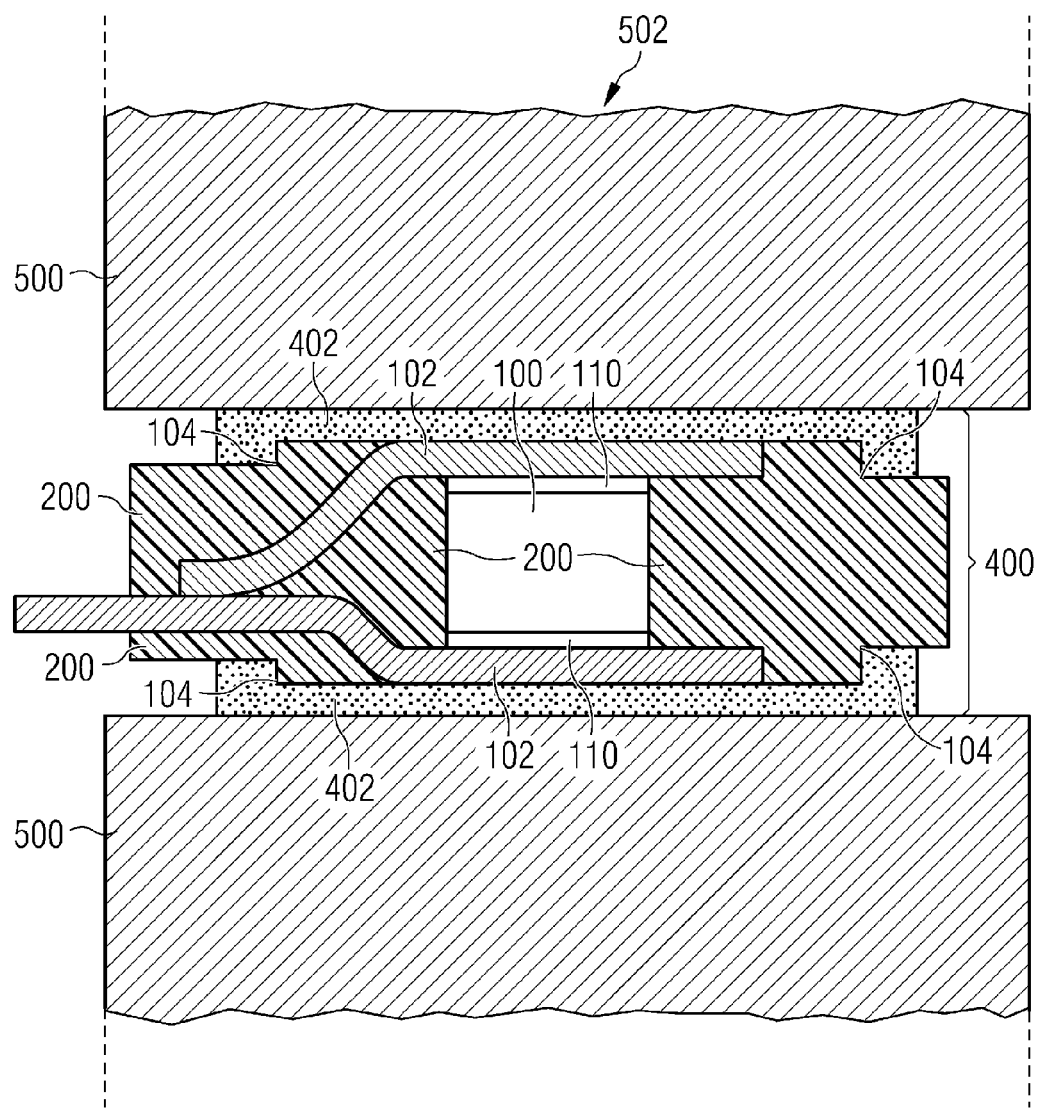
FIG. 11 depicts an electronic arrangement in accordance with another exemplary embodiment, with a double-sided cooling system, which is formed by mounting a heat dissipation element respectively on both sides, on two thermal interface structures formed on the opposing main surfaces of a semiconductor package.

FIG. 11 depicts an electronic arrangement 502 in accordance with another exemplary embodiment, with a double-sided cooling system, which is formed by mounting a heat dissipation element 500 respectively on both sides, on two thermal interface structures 402 formed on the opposing main surfaces of a semiconductor package 400. Thus, the thermal interface structures 402 are created here in the form of two discontinuous sections.

In the exemplary embodiment depicted in FIG. 11, the electronic chip 100 is extensively electrically and mechanically connected to a respective electrical carrier 102 on its two opposing main surfaces, by means of bonding. In accordance with FIG. 11, the two electrical carriers 102 sandwiching the electronic chip 100 are formed as two lead frames. As depicted in FIG. 11, the electronic chip 100 and the electrical carriers 102 are encapsulated, in this case, by means of molding, which forms an encapsulation structure 200. Thereby, a first section of one of the electrical carriers 102 is covered by the encapsulation structure 200, while a second section of this electrical carrier 102 protrudes from the encapsulation structure 200 in order to connect to an electronic periphery (not depicted). The other electrical carrier 102 is coupled to the previously described electrical carrier 102 in the interior of the encapsulation structure 200.

As depicted in FIG. 11, the discontinuities 104 are formed here as steps. These steps also bring about an increase in the effective fastening surface between the encapsulation structure 200 and, in this case, two separate thermal interface structures 402, which, on the one hand, improves the mechanical fastening properties and, on the other hand, improves the reliability of the electrical insulation.

Since thermal interface structures 402 are provided on both opposing main surfaces (comprising the steps) of the encapsulation structure 200 and on exposed surface sections of a respective electrical carrier 102, a respective heat dissipation element 500 can also be mounted on each of the interface structures 402. Double-sided cooling is thus achieved. The heat dissipation element 500 can be formed from, for example, aluminum, copper, or a good heat-conductive ceramic material.

For example, a cooling fluid (such as water or air) can flow along or be guided along the heat dissipation elements 500, whereby a thermal exchange is facilitated, and thus heat can be very efficiently dissipated. Of course, other configurations of the heat dissipation element are also possible.

Additionally, it should be noted that "comprising" does not exclude any other elements or steps and that "one" or "a" does not exclude more than one. It should further be pointed out that characteristics or steps which have been described with reference to one of the above exemplary embodiments can also be used in combination with other characteristics or steps of the other exemplary embodiments described above. Reference numerals in the Claims should not be viewed as limiting.

The invention claimed is:

1. Electronic semiconductor package, comprising:
an electronic chip;
a carrier coupled to the electronic chip;
an encapsulation structure at least partially encapsulating the electronic chip and partially encapsulating the carrier, wherein the encapsulation structure has a discontinuity; and
an electrically insulating thermal interface structure, which covers at least a part of the discontinuity and a volume connected thereto, which volume adjoins an exposed surface section of the carrier, wherein the thermal interface structure electrically decouples at least a part of the carrier with respect to a surrounding of the carrier,
wherein the discontinuity is an annular discontinuity, which surrounds a surface section of the carrier circumferentially and which extends into the encapsulation structure,
wherein side walls of the encapsulation structure surrounding the discontinuity are inclined by an angle in a range of between 5° and 35° with respect to a vertical extension into the encapsulation structure.

2. Electronic semiconductor package in accordance with claim 1, wherein the thermal interface structure is in direct contact with the carrier within the discontinuity.

3. Electronic semiconductor package in accordance with claim 1, wherein the thermal interface structure has a thickness in a range between 20 µm and 500 µm.

4. Electronic semiconductor package in accordance with claim 1, wherein the thermal interface structure comprises a solid body layer of a matrix with filling particles embedded therein.

5. Electronic semiconductor package in accordance with claim 1, wherein the thermal interface structure comprises a viscous formless material.

6. Electronic semiconductor package in accordance with claim 1, wherein the encapsulation structure has multiple discontinuities, which are at least partially covered by the electrically insulating thermal interface structure.

7. Electronic semiconductor package in accordance with claim 1, wherein the thermal interface structure has a higher thermal conductivity than the encapsulation structure.

8. Electronic arrangement, comprising:
an electronic semiconductor package, comprising:
an electronic chip;
a carrier coupled to the electronic chip;
an encapsulation structure at least partially encapsulating the electronic chip and partially encapsulating the carrier, wherein the encapsulation structure has a discontinuity; and
an electrically insulating thermal interface structure, which covers at least a part of the discontinuity and a volume connected thereto, which volume adjoins an exposed surface section of the carrier, wherein the thermal interface structure electrically decouples at least a part of the carrier with respect to a surrounding of the carrier;
wherein the discontinuity is an annular discontinuity, which surrounds a surface section of the carrier circumferentially and which extends into the encapsulation structure,
wherein side walls of the encapsulation structure surrounding the discontinuity are inclined by an angle in a range of between 5° and 35° with respect to a vertical extension into the encapsulation structure.

a heat dissipation element, which is connected externally to the thermal interface structure to provide a thermal coupling with the carrier.

\* \* \* \* \*